(12) United States Patent
Miyamae et al.

(10) Patent No.: US 10,311,965 B2
(45) Date of Patent: Jun. 4, 2019

(54) SEMICONDUCTOR CIRCUIT

(71) Applicant: Toshiba Memory Corporation, Tokyo (JP)

(72) Inventors: Tsutomu Miyamae, Yokohama Kanagawa (JP); Nariyuki Fukuda, Yokohama Kanagawa (JP); Kazuhito Hosaka, Kawasaki Kanagawa (JP); Takeshi Yamaguchi, Kamakura Kanagawa (JP); Suguru Tahara, Yokohama Kanagawa (JP); Isao Ooigawa, Kawasaki Kanagawa (JP); Keitarou Mishima, Yokohama Kanagawa (JP); Yuichiro Sanuki, Urayasu Chiba (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 93 days.

(21) Appl. No.: 15/691,714

(22) Filed: Aug. 30, 2017

(65) Prior Publication Data

US 2018/0233213 A1 Aug. 16, 2018

(30) Foreign Application Priority Data

Feb. 15, 2017 (JP) .................. 2017-025840

(51) Int. Cl.
| | | |
|---|---|---|
| G11C 29/00 | (2006.01) | |
| G11C 29/38 | (2006.01) | |
| G11C 29/44 | (2006.01) | |
| G01R 31/3185 | (2006.01) | |

(52) U.S. Cl.
CPC ...... *G11C 29/38* (2013.01); *G01R 31/318536* (2013.01); *G11C 29/44* (2013.01)

(58) Field of Classification Search
CPC . G11C 29/38; G11C 29/44; G11C 2029/3202; G01R 31/318533; G01R 31/318536
USPC ....... 714/718, 719, 726, 729, 733, 734, 735, 714/736, 737, 824, 819, 30; 365/200, 365/201
See application file for complete search history.

(56) References Cited

U.S. PATENT DOCUMENTS

| | | | |
|---|---|---|---|
| 6,915,247 B1 * | 7/2005 | Aguro | G06F 21/10 703/6 |
| 9,330,788 B2 | 5/2016 | Anzou | |
| 2005/0268185 A1 * | 12/2005 | Vinke | G11C 29/1201 714/718 |
| 2005/0289423 A1 | 12/2005 | Yabuta | |

(Continued)

FOREIGN PATENT DOCUMENTS

| | | |
|---|---|---|
| JP | H10-083696 A | 3/1998 |
| JP | 4894376 B2 | 3/2012 |

*Primary Examiner* — Christine T. Tu
(74) *Attorney, Agent, or Firm* — Kim & Stewart LLP (57) ABSTRACT

According to one embodiment, a semiconductor circuit includes a plurality of memories. The memories are connected to one another in series such that an output node of the memory of the first stage is connected to an input node of the memory of the second stage. The semiconductor circuit includes a test circuit that outputs test data to an input node of the memory of the first stage among the plurality of memories, and a comparison circuit that compares data output from an output node of the memory of the final stage among the plurality of memories with expectation value data.

17 Claims, 7 Drawing Sheets

(56) References Cited

U.S. PATENT DOCUMENTS

2012/0166901 A1\* 6/2012 Kim ................ G01R 31/31855
 714/726
2014/0340975 A1\* 11/2014 Nakatani ................ G11C 29/44
 365/201

\* cited by examiner

SEMICONDUCTOR CIRCUIT

CROSS-REFERENCE TO RELATED APPLICATION

This application is based upon and claims the benefit of priority from Japanese Patent Application No. 2017-025840, filed Feb. 15, 2017, the entire contents of which are incorporated herein by reference.

FIELD

Embodiments described herein relate generally to a semiconductor circuit.

BACKGROUND

A semiconductor circuit mounted with a built-in self test circuit (hereinafter, a BIST circuit) is known.

DETAILED DESCRIPTION

An example embodiment provides a semiconductor circuit capable of performing a test of a memory by adding a small scale circuit.

In general, according to one embodiment, a semiconductor circuit includes a number of memories, wherein the number is an integer greater than or equal to two and includes a first memory, a kth memory, and a (k+1) memory and k+1 is less than or equal to the number of memories, wherein each of the memories includes an input node, an output node, and a plurality of memory cells, selects some of the plurality of memories according to an address signal input external to the memory, stores data input via the input node in the selected memory cell, reads the data stored in the selected memory cell, and outputs the read data via the output node; the number of memories are connected to one another in series such that the output node of the kth memory is connected to the input node the (k+1)memory; and the semiconductor circuit further includes a test circuit that outputs test data and expectation value data and outputs the test data to the input node of a memory of the first memory, and a comparison circuit that compares data output from the output node of the last memory with the expectation value data.

In the following, example embodiments are described with reference to the drawings. In the following description, common reference numerals are used to designate elements having the same function and configuration.

1. Configuration of Semiconductor Circuit According to Present Embodiment

Figure 1:
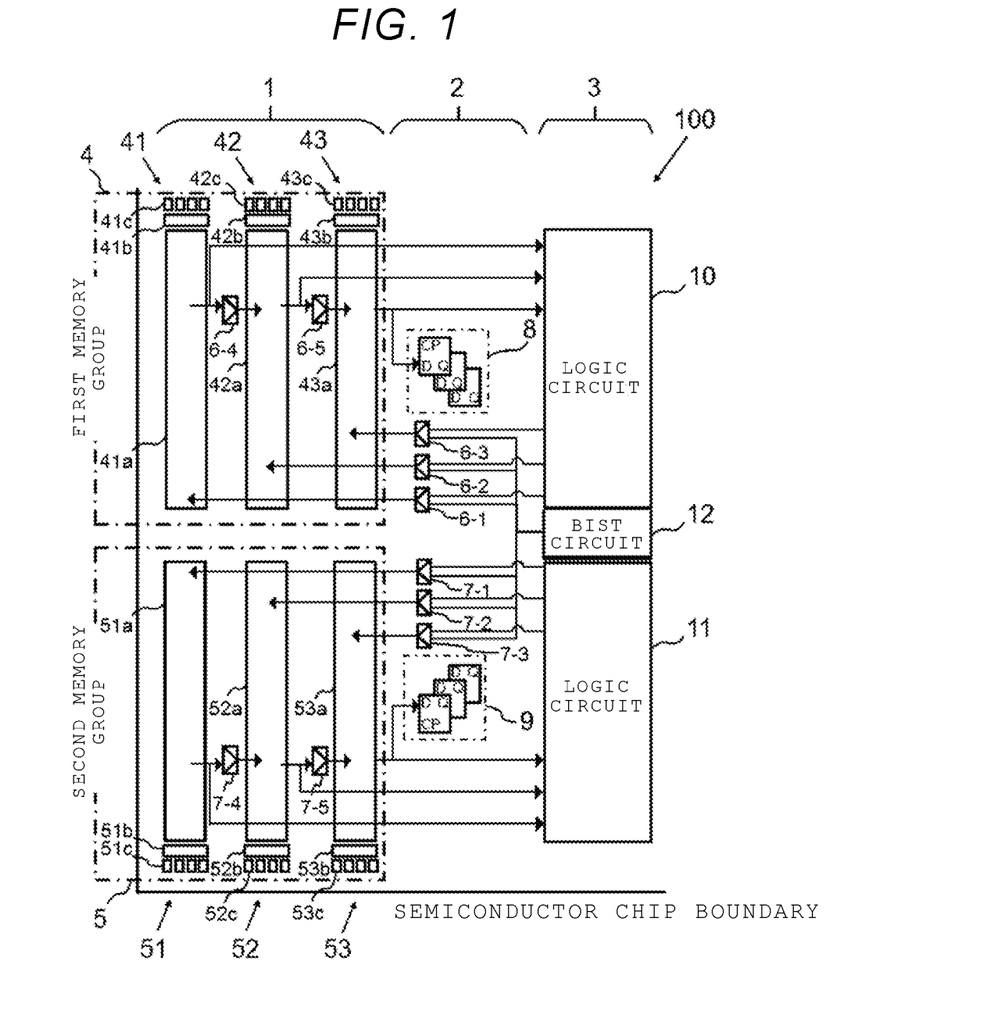
FIG. 1 is an overall configuration diagram of a semiconductor circuit according to an embodiment.

First, the configuration of the semiconductor circuit according to the present embodiment is described using FIG. 1. FIG. 1 is an overall configuration diagram of the semiconductor circuit according to the present embodiment.

As illustrated in FIG. 1, a semiconductor circuit 100 according to the present embodiment is formed with a circuit in a peripheral region 1, an intermediate region 2, and a center region 3 of a semiconductor chip. The peripheral region 1 is a region adjacent to one side of the semiconductor chip. The center region 3 is a region separated from a side of the semiconductor chip to which the peripheral region 1 is adjacent. The intermediate region 2 is a region positioned between the peripheral region 1 and the center region 3.

The peripheral region 1 is provided with a first memory group 4 and a second memory group 5. The first memory group 4 includes three RAMs (Random Access Memories) 41, 42, and 43. The RAMs 41, 42, and 43 each can independently perform a write operation and a read operation. The RAM 41 includes a memory cell array 41*a*, a redundant cell array 41*b*, and a flip-flop 41*c*. The RAM 42 includes a memory cell array 42*a*, a redundant cell array 42*b*, and a flip-flop 42*c*. The RAM 43 includes a memory cell array 43*a*, a redundant cell array 43*b*, and a flip-flop 43*c*. Each of the RAMs 41, 42, and 43 has input nodes and output nodes. Each of the RAMs 41, 42, and 43 stores data to be written (hereinafter, write data) received from the input node in the write operation, and outputs data to be read (hereinafter, read data) to the output node in the read operation.

The second memory group 5 includes three RAMs 51, 52, and 53. The RAMs 51, 52, and 53 each can independently perform a write operation and a read operation. The RAM 51 includes a memory cell array 51*a*, a redundant cell array 51*b*, and a flip-flop 51*c*. The RAM 52 includes a memory cell array 52*a*, a redundant cell array 52*b*, and a flip-flop 52*c*. The RAM 53 includes a memory cell array 53*a*, a redundant cell array 53*b*, and a flip-flop 53*c*. Each of the RAMs 51, 52, and 53 has input nodes and output nodes. Each of the RAMs 51, 52, and 53 stores write data received from the input node in the write operation, and outputs read data to the output node in the read operation.

In one embodiment, the RAMs 41, 42, 43, 51, 52, and 53 are a static random access memories (SRAMs). In the following description, when the RAMs 41, 42, 43, 51, 52, and 53 are not distinguished from one another, each of them is written as a "RAM" without adding reference numerals. Similarly, for example, for elements of the RAMs such as the memory cell array 41*a* and the like, when elements included in the RAMs are not distinguished from one another, the memory cell arrays referenced as "memory cell array" without adding reference numerals The flip-flop 41*c* receives defective address information from a fuse element (e.g., a fuse element 13 of FIG. 2). The RAM 41 performs a shift operation of an address by using the defective address information stored in the flip-flop 41*c*. The shift operation is described in detail later. The redundant cell array 41*b* is used to store data when the shift operation is performed. The flip-flops 42*c* and 43*c* receive defective address information, which is similar to the defective address information stored in the flip-flop 41c, from the fuse element. The RAMs 42 and 43 perform a shift operation of an address similar to the RAM 41, and the redundant cell arrays 42b and 43b are used to store data.

The flip-flops 51c, 52c, and 53c also receive defective address information from the fuse element. The defective address information stored in the flip-flops 51c, 52c, and 53c may differ from the defective address information stored in the flip-flops 41c, 42c, and 43c. The RAMs 51, 52, and 53 perform a shift operation of an address based on the defective address information, and the redundant cell arrays 51b, 52b, and 53b are used to store data.

The intermediate region 2 is provided with selectors 6-1, 6-2, 6-3, 7-1, 7-2, and 7-3, and capture registers 8 and 9. The center region 3 is provided with logic circuits 10 and 11 and a BIST (Built-In Self Test) circuit 12. The logic circuit 10 reads data from the first memory group 4, performs various arithmetic operations, and stores a result of the arithmetic operations in the first memory group 4. The logic circuit 11 reads data from the second memory group 5, performs various arithmetic operations, and stores a result of the arithmetic operations in the second memory group 5. The BIST circuit 12 writes data of a predetermined pattern (hereinafter, pattern data) in the first memory group 4 and the second memory group 5, and reads the pattern data from the first memory group 4 and the second memory group 5, thereby performing a test of the first memory group 4 and the second memory group 5.

During normal operation of the semiconductor circuit 100, the logic circuit 10 transmits a control signal for writing data in the first memory group 4 and write data to the selectors 6-1, 6-2, and 6-3. Furthermore, the logic circuit 10 transmits a control signal for reading data from the first memory group 4 to the selectors 6-1, 6-2, and 6-3. Similarly, the logic circuit 11 transmits a control signal for writing data in the second memory group 5 and write data to the selectors 7-1, 7-2, and 7-3. Furthermore, the logic circuit 11 transmits a control signal for reading data from the second memory group 5 to the selectors 7-1, 7-2, and 7-3.

During test operation of the semiconductor circuit 100, the BIST circuit 12 transmits a control signal for writing pattern data in the first memory group 4 and the pattern data to the selectors 6-1, 6-2, and 6-3. Furthermore, the BIST circuit 12 transmits a control signal for reading the pattern data from the first memory group 4 to the selectors 6-1, 6-2, and 6-3. Similarly, the BIST circuit 12 transmits a control signal for writing pattern data in the second memory group 5 and the pattern data to the selectors 7-1, 7-2, and 7-3. Furthermore, the BIST circuit 12 transmits a control signal for reading the pattern data from the second memory group 5 to the selectors 7-1, 7-2, and 7-3.

The selector 6-1 transmits the control signal received from the logic circuit 10 to the RAM 41 during normal operation of the semiconductor circuit 100. Furthermore, when the logic circuit 10 writes data in the RAM 41, the selector 6-1 transmits the write data received from the logic circuit 10 to the RAM 41. The selector 6-2 transmits the control signal received from the logic circuit 10 to the RAM 42 during the normal operation of the semiconductor circuit 100. Furthermore, when the logic circuit 10 writes data in the RAM 42, the selector 6-2 transmits the write data received from the logic circuit 10 to the RAM 42. The selector 6-3 transmits the control signal received from the logic circuit 10 to the RAM 43 during the normal operation of the semiconductor circuit 100. Furthermore, when the logic circuit 10 writes data in the RAM 43, the selector 6-3 transmits the write data received from the logic circuit 10 to the RAM 43.

The selector 6-1 transmits the control signal received from the BIST circuit 12 to the RAM 41 and transmits the pattern data received from the BIST circuit 12 to the RAM 41 during the test operation of the semiconductor circuit 100. The selector 6-2 transmits the control signal received from the BIST circuit 12 to the RAM 42 during the test operation of the semiconductor circuit 100. The selector 6-3 transmits the control signal received from the BIST circuit 12 to the RAM 43 during the test operation of the semiconductor circuit 100.

The selector 7-1 transmits the control signal received from the logic circuit 11 to the RAM 51 during the normal operation of the semiconductor circuit 100. Furthermore, when the logic circuit 11 writes data in the RAM 51, the selector 7-1 transmits the write data received from the logic circuit 11 to the RAM 51. The selector 7-2 transmits the control signal received from the logic circuit 11 to the RAM 52 during the normal operation of the semiconductor circuit 100. Furthermore, when the logic circuit 11 writes data in the RAM 52, the selector 7-2 transmits the write data received from the logic circuit 11 to the RAM 52. The selector 7-3 transmits the control signal received from the logic circuit 11 to the RAM 53 during the normal operation of the semiconductor circuit 100. Furthermore, when the logic circuit 11 writes data in the RAM 53, the selector 7-3 transmits the write data received from the logic circuit 11 to the RAM 53.

The selector 7-1 transmits the control signal received from the BIST circuit 12 to the RAM 51, and transmits the pattern data received from the BIST circuit 12 to the RAM 51 at the time of the test operation of the semiconductor circuit 100. The selector 7-2 transmits the control signal received from the BIST circuit 12 to the RAM 52 during the test operation of the semiconductor circuit 100. The selector 7-3 transmits the control signal received from the BIST circuit 12 to the RAM 53 during the test operation of the semiconductor circuit 100.

During the test operation of the semiconductor circuit 100, the RAMs 41, 42, and 43 operate as follows.

The pattern data is transmitted to the input node of the RAM 41 from the BIST circuit 12. The RAM 41 performs the write operation according to the control signal received from the BIST circuit 12, and stores the pattern data received from the BIST circuit 12 in the memory cell array 41a. Furthermore, the RAM 41 performs the read operation according to the control signal received from the BIST circuit 12, and reads the pattern data stored in the memory cell array 41a in the previous write operation. The read pattern data is transmitted to the input node of the RAM 42 from the output node of the RAM 41 via the selector 6-4.

The RAM 42 performs the write operation according to the control signal received from the BIST circuit 12, and stores the pattern data received from the RAM 41 in the memory cell array 42a. Furthermore, the RAM 42 performs the read operation according to the control signal received from the BIST circuit 12, and reads the pattern data stored in the memory cell array 42a in the previous write operation. The read pattern data is transmitted to the input node of the RAM 43 from the output node of the RAM 42 via the selector 6-5.

The RAM 43 performs the write operation according to the control signal received from the BIST circuit 12, and stores the pattern data received from the RAM 42 in the memory cell array 43a. Furthermore, the RAM 43 performs the read operation according to the control signal received from the BIST circuit 12, and reads the pattern data stored in the memory cell array 43a in the previous write operation. The read pattern data is transmitted to the capture register 8 from the output node of the RAM 43.

The capture register 8 stores the data output from the RAM 43. If there is no defect in the RAMs 41, 42, and 43 resulting from data writing and reading, the data output from the RAM 43 coincides with pattern data initially input to the RAM 41. The pattern data is used as expectation value data and the data stored in the capture resister 8 is compared with the expectation value data, so that the presence or absence of a defect in the RAMs 41, 42, and 43 is detected.

As described above, during the test operation of the semiconductor circuit 100, the RAMs 41, 42, and 43 are connected to one another in series such that an output node of a RAM of a k-th stage (k is a natural number satisfying k+1≤3) is connected to an input node of a RAM of a (k+1)-th stage. The RAM of the first stage corresponds to the RAM 41. The RAM of the second stage corresponds to the RAM 42. The RAM of the third stage corresponds to the RAM 43.

During the normal operation of the semiconductor circuit 100, each of the RAMs 41, 42, and 43 directly exchanges data with the logic circuit 10. The RAMs 41, 42, and 43 are connected in parallel to the logic circuit 10. The RAMs 41, 42, and 43 receive write data from the logic circuit 10 without passing through RAMs (for example, the RAMs 41 and 42 with respect to the RAM 43) of a front stage when they are connected to one another in series, and transmit read data to the logic circuit 10 without passing through RAMs (for example, the RAMs 42 and 43 with respect to the RAM 41) of a rear stage.

So far, the normal operation and the test operation of the semiconductor circuit 100 have been described using the first memory group 4 as an example; however, the second memory group 5 performs similar operations. In the above description, the first memory group 4 is replaced with the second memory group 5, the selectors 6-1, 6-2, and 6-3 are replaced with the selectors 7-1, 7-2, and 7-3, and the capture resister 8 is replaced with the capture resister 9, so that it is possible to obtain a description for the operations of the second memory group 5.

Figure 2:
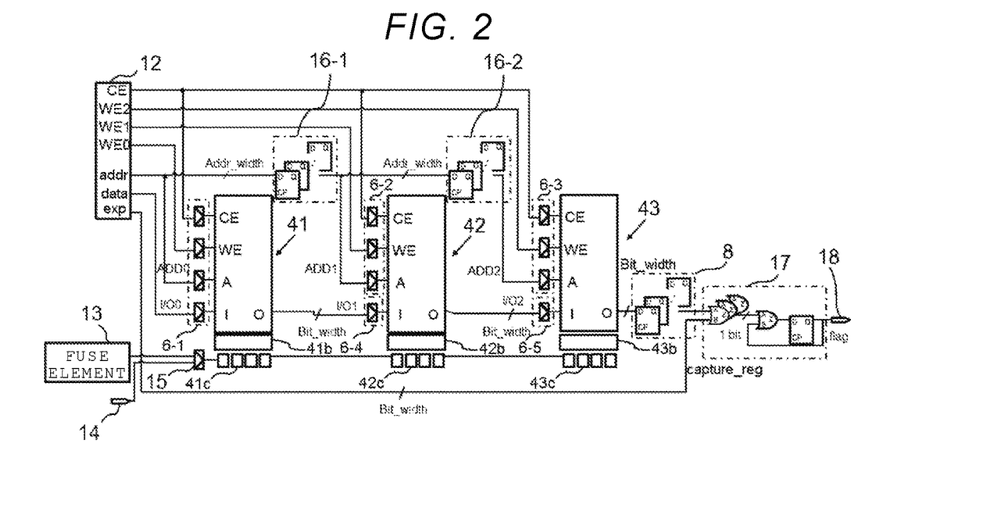
FIG. 2 is a detailed configuration diagram of a semiconductor circuit according to an embodiment.

Next, a detailed configuration of the semiconductor circuit according to the present embodiment is described using FIG. 2. For the purpose of convenience, FIG. 2 illustrates the first memory group 4 and peripheral circuits thereof, of the semiconductor circuit 100 illustrated in FIG. 1.

As illustrated in FIG. 2, the semiconductor circuit 100 includes the fuse element 13, an input terminal 14, a selector 15, address registers 16-1 and 16-2, a comparison circuit 17, and an output node 18. The fuse element 13 stores the defective address information as described above. The input terminal 14 can receive data from outside of the semiconductor chip, and is used to set the defective address information, which is stored in the flip-flops 41c, 42c, and 43c. The selector 15 selects one of the output of the fuse element 13 and the output of the input terminal 14 and outputs the selected output to the flip-flop 41c.

The selector 6-1 selects one of the output of the logic circuit 10 and the output of the BIST circuit 12 and outputs the selected output to the RAM 41. The selector 6-2 selects one of the output of the logic circuit 10 and the output of the BIST circuit 12/the address register 16-1 and outputs the selected output to the RAM 42. The selector 6-3 selects one of the output of the logic circuit 10 and the output of the BIST circuit 12/the address register 16-2 and outputs the selected output to the RAM 43.

The BIST circuit 12 outputs a clock signal CLK, a chip enable signal CE, write enable signals WE0, WE1, and WE2, an address signal addr, pattern data data, and expectation value data exp. The clock signal CLK is supplied to the RAMs 41, 42, and 43 to operate the RAMs 41, 42, and 43. The write enable signals WE0, WE1, and WE2 are control signals for transferring whether a required operation is a write operation or a read operation to a RAM. The write enable signals WE0, WE1, and WE2 indicate a write operation when asserted and indicate a read operation when negated. The write enable signal WE0 is supplied to the RAM 41. The write enable signal WE1 is supplied to the RAM 42. The write enable signal WE2 is supplied to the RAM 43. The address signal addr is a control signal for designating a write target or read target memory cell of a RAM. The address signal addr is supplied to the RAM 41 as an address signal ADD0.

The address register 16-1 latches the address signal addr, which was output from the BIST circuit 12, in synchronization with the clock signal CLK, and supplies the latched address signal to the RAM 42 as an address signal ADD1. The address register 16-2 latches the address signal ADD1, which was output from the address register 16-1, in synchronization with the clock signal CLK, and supplies the latched address signal to the RAM 43 as an address signal ADD2. By the latch operations of the address registers 16-1 and 16-2, the address signal ADD1 becomes a signal obtained by delaying the address signal the address signal ADD0 by one cycle of the clock signal CLK, and the address signal ADD2 becomes a signal obtained by delaying the address signal the address signal ADD0 by two cycles of the clock signal CLK.

The comparison circuit 17 compares output data capture_reg of the RAM 43 held in the capture resister 8 with the expectation value data exp. The output node 18 outputs a comparison result flag of the comparison circuit 17.

Figure 3:
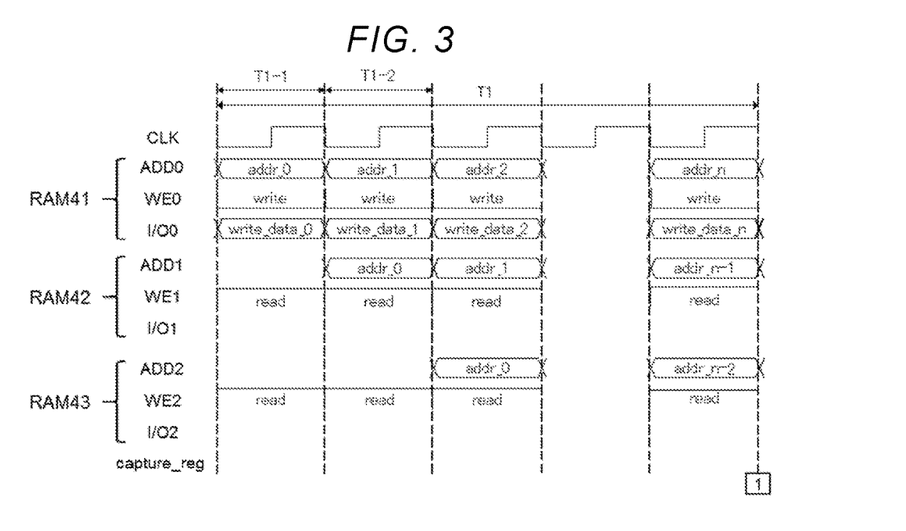
FIG. 3 is a first timing chart of various signals at the time of a test operation of a semiconductor circuit according to an embodiment.
Figure 4:
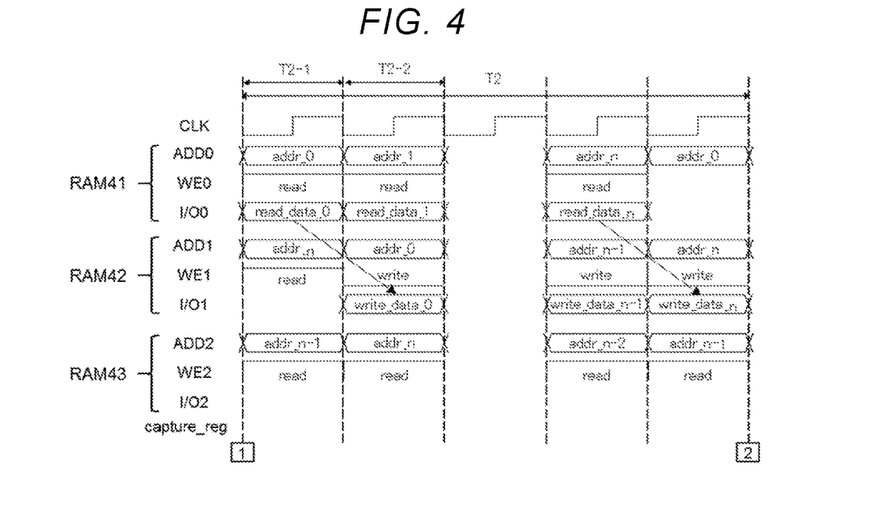
FIG. 4 is a second timing chart of various signals at the time of a test operation of a semiconductor circuit according to an embodiment.
Figure 5:
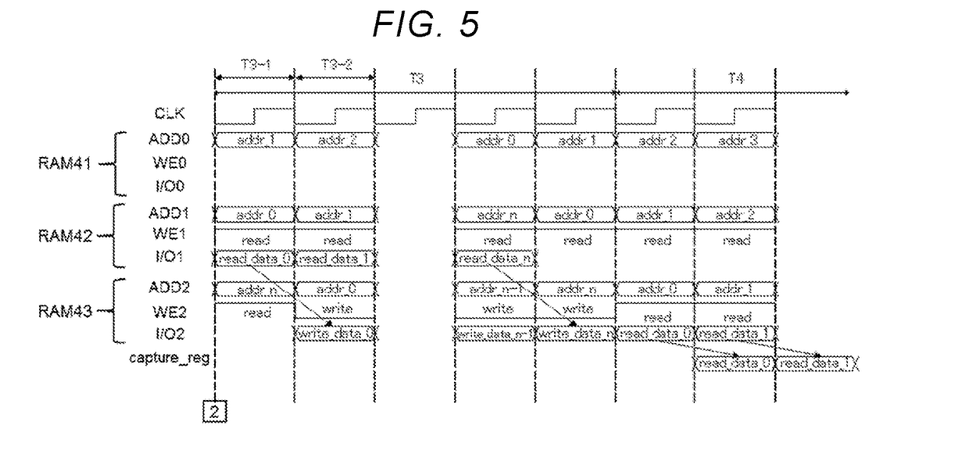
FIG. 5 is a third timing chart of various signals at the time of a test operation of a semiconductor circuit according to an embodiment.

FIGS. 3 to 5 are timing charts of various signals at the time of the test operation of the semiconductor circuit according to an embodiment.

In a period T1 illustrated in FIG. 3, writing of pattern data for the RAM 41 is performed. Initially, the BIST circuit 12 performs writing of pattern data write_data_0 for the RAM 41 (period T1-1). Specifically, the BIST circuit 12 transmits an address signal addr_0 and the pattern data write_data_0 to the RAM 41 while asserting the write enable signal WE0. The pattern data write_data_0 is written in a memory cell designated with the address signal addr_0.

Subsequently, the BIST circuit 12 performs writing of pattern data write_data_1 for the RAM 41 (period T1-2). Specifically, the BIST circuit 12 transmits an address signal addr_1 and the pattern data write_data_1 to the RAM 41 while asserting the write enable signal WE0. The pattern data write_data_1 is written in a memory cell designated with the address signal addr_1. The address signal addr_1 is a signal obtained by incrementing or decrementing an address of the address signal addr_0.

In a similar way, the BIST circuit 12 writes the pattern data in a memory cell designated with an address signal while incrementing or decrementing an address signal. This write operation is repeated until the pattern data is written in all memory cells of the RAM 41.

Next, in a period T2 illustrated in FIG. 4, reading of the pattern data written in the RAM 41 in the period T1 from the RAM 41 and writing of the pattern data read from the RAM 41 to the RAM 42 are performed. The end time point (the time point written as "1" in FIG. 3) of the period T1 and the start time point (the time point written as "1" in FIG. 4) of the period T2 are the same time point, and the operation in the period T1 and the operation in the period T2 are continuously performed.

Initially, the BIST circuit 12 performs reading of data read_data_0 from the RAM 41 (period T2-1). Specifically, the BIST circuit 12 transmits the address signal addr_0 to the RAM 41 while negating the write enable signal WE0. The data read_data_0 is read from a memory cell designated with the address signal addr_0. The data read_data_0 is transmitted to the RAM 42 as the data write_data_0.

Subsequently, the BIST circuit 12 performs reading of data read_data_1 from the RAM 41 and writing of the data write_data_0 to the RAM 42 in parallel with each other (period T2-2). Specifically, the BIST circuit 12 transmits the address signal addr_1 to the RAM 41 while negating the write enable signal WE0. The data read_data_1 is read from a memory cell designated with the address signal addr_1 and is output to the RAM 42. Furthermore, the BIST circuit 12 asserts the write enable signal WE1. In this case, the address register 16-1 transmits, to the RAM 42, the address signal addr_0 output from the BIST circuit 12 at a previous cycle of the clock signal CLK. The data write_data_0 is written in a memory cell designated with the address signal addr_0.

In a similar way, the BIST circuit 12 reads data from the RAM 41 while incrementing or decrementing an address signal, and writes the read data in the RAM 42. This write operation is repeated until data is written in all memory cells of the RAM 42.

Next, in a period T3 illustrated in FIG. 5, reading of the pattern data written in the RAM 42 in the period T2 from the RAM 42 and writing of the pattern data read from the RAM 42 to the RAM 43 are performed. The end time point (the time point written as "2" in FIG. 4) of the period T2 and the start time point (the time point written as "2" in FIG. 5) of the period T3 are the same time point, and the operation in the period T2 and the operation in the period T3 are continuously performed.

Initially, the BIST circuit 12 performs reading of the data read_data_0 from the RAM 42 (period T3-1). Specifically, the BIST circuit 12 transmits the address signal addr_0 to the RAM 42 while negating the write enable signal WE1. The data read_data_0 is read from the memory cell designated with the address signal addr_0. The data read_data_0 is transmitted to the RAM 43 as the data write_data_0.

Subsequently, the BIST circuit 12 performs reading of the data read_data_1 from the RAM 42 and writing of the data write_data_0 to the RAM 43 in parallel with each other (period T3-2). Specifically, the BIST circuit 12 transmits the address signal addr_1 to the RAM 42 while negating the write enable signal WE1. The data read_data_1 is read from the memory cell designated with the address signal addr_1 and is output to the RAM 43. Furthermore, the BIST circuit 12 asserts the write enable signal WE2. In this case, the address register 16-2 transmits, to the RAM 43, the address signal addr_0 output from the address register 16-1 at a previous cycle of the clock signal CLK. The data write_data_0 is written in the memory cell designated with the address signal addr_0.

In a similar way, the BIST circuit 12 reads data from the RAM 42 while incrementing or decrementing an address signal, and writes the read data in the RAM 43. This write operation is repeated until data is written in all memory cells of the RAM 43.

Next, in a period T4, reading of the pattern data written in the RAM 43 in the period T3 is performed. The BIST circuit 12 transmits the address signal addr_0 to the RAM 42 while negating the write enable signal WE2. The data read_data_0 is read from the memory cell designated with the address signal addr_0 and delivered to the capture resister 8. The capture resister 8 holds the data read_data_0 as the data capture_reg. The comparison circuit 17 compares the data capture_reg with the pattern data write_data_0 which is the expectation value data.

In a similar way, the BIST circuit 12 reads data from the RAM 43 while incrementing or decrementing an address signal, and compares the read data with the pattern data. This read operation is repeated until the data read from all the memory cells of the RAM 43 is compared with the pattern data.

Figure 6:
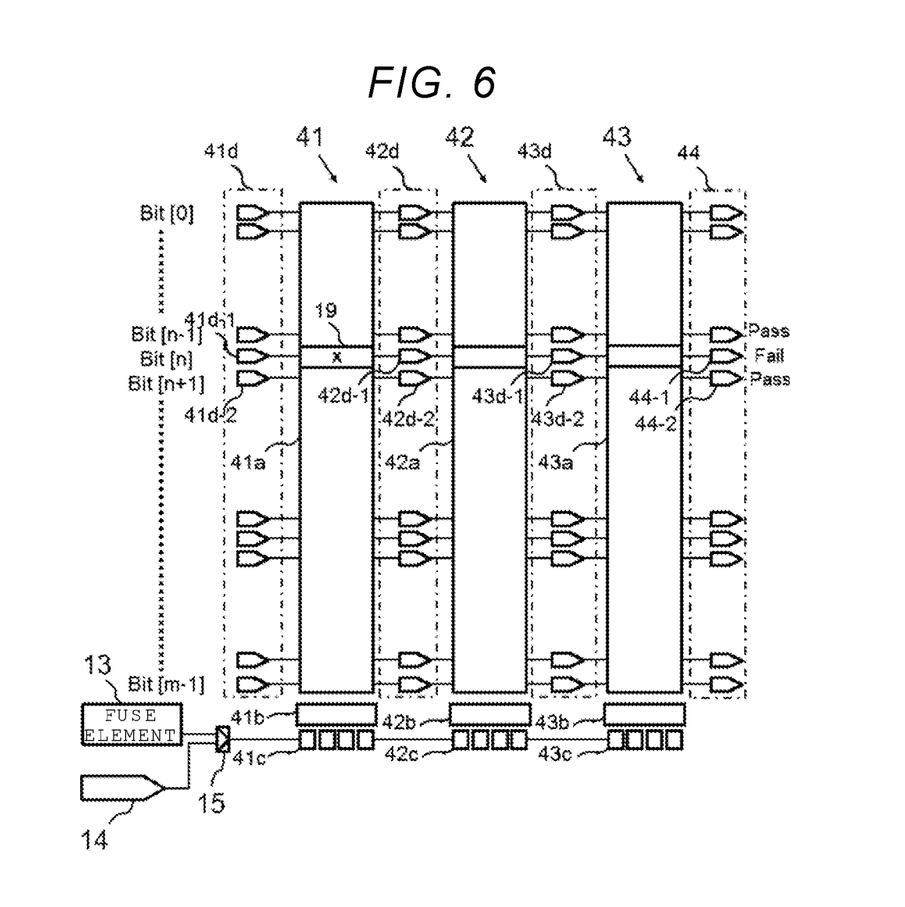
FIG. 6 is a first diagram that illustrates a shift operation of a semiconductor circuit according to an embodiment.
Figure 7:
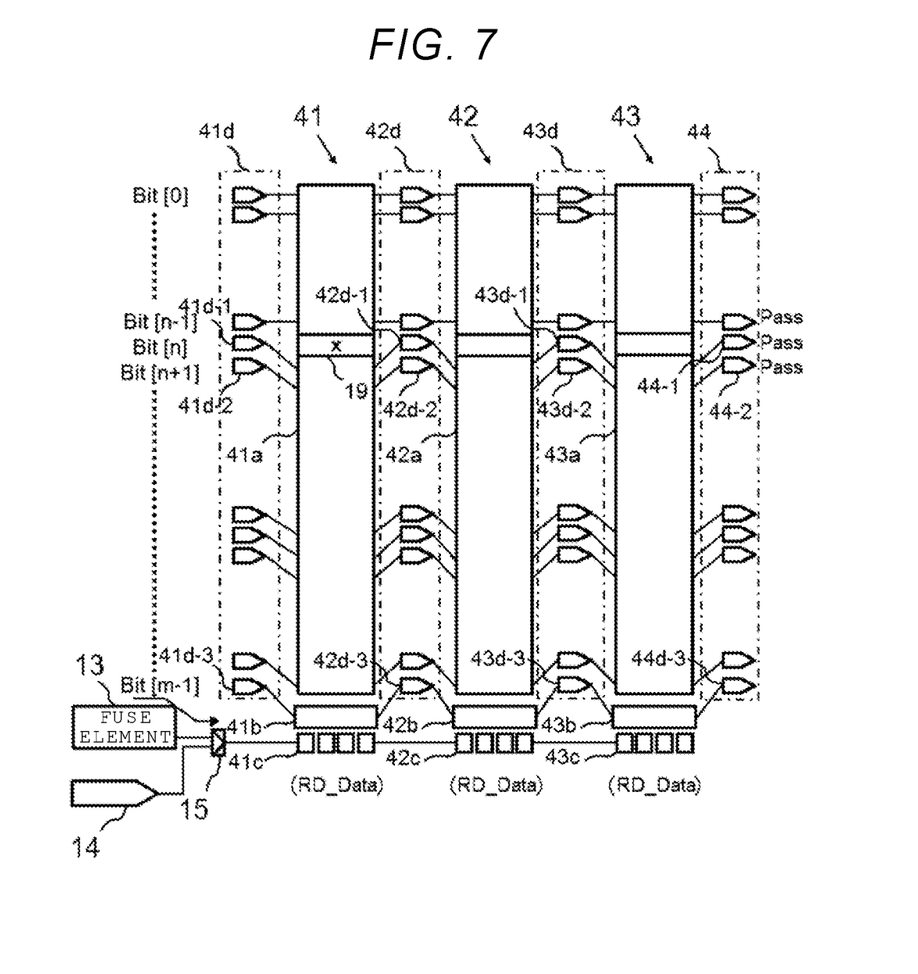
FIG. 7 is a second diagram that illustrates a shift operation of a semiconductor circuit according to an embodiment.

Next, the shift operation of the semiconductor circuit according to the present embodiment is described using FIGS. 6 and 7. In the following, with reference to FIG. 6, the test of the semiconductor circuit 100 at the time of product shipment is described. Furthermore, with reference to FIG. 7, relief of an initial defect detected at the time of product shipment is described. In the following, the following description is given using the RAMs 41, 42, and 43 as an example.

FIG. 6 illustrates a connection relation between a memory cell array before the shift operation is performed and input nodes and output nodes of a RAM. FIG. 6 illustrates a connection relation when the input nodes and the output nodes of the RAMs 41, 42, and 43 are connected to each other in series (during the test operation of the semiconductor circuit 100).

As illustrated in FIG. 6, the semiconductor circuit 100 includes an input node group 41d, an input/output node group 42d, an input/output node group 43d, and an output node group 44. The input node group 41d corresponds to the input node of the RAM 41. The input/output node group 42d corresponds to the output node of the RAM 41 and the input node of the RAM 42. The input/output node group 43d corresponds to the output node of the RAM 42 and the input node of the RAM 43. The output node group 44 corresponds to the output node of the RAM 43. Each of the input node group 41d, the input/output node groups 42d and 43d, and the output node group 44 is configured from m nodes corresponding to a bit width of the input/output of a RAM (which is m bits). To the m nodes, write data to be input to the RAM or read data (Bit [m−1:0]) to be output from the RAM is sequentially assigned from lower bits to and upper bits.

It is assumed that a defect occurs in a position 19 indicated by "x" of the memory cell array 41a. In the following, a memory cell of the position 19 is called a first defective cell. In FIG. 6, defective address information is not stored in the fuse element 13. Therefore, since the defective address information is not transmitted to the flip-flops 41c, 42c, and 43c, it is not stored in the flip-flops 41c, 42c, and 43c.

During the write operation of the RAM, m memory cells in a memory cell array and one memory cell in a redundant cell array are selected by an address signal input to the RAM. When the defective address information is not stored in the flip-flops, the m memory cells in the memory cell array between the m memory cells in the memory cell array and the one memory cell in the redundant cell array selected by the address signal are connected to the input nodes and the output nodes of m RAMs in a one-to-one manner, and the one memory cell in the redundant cell array is not connected to the input node and the output node of the RAM. The write data input from the input node of the RAM is stored in the selected m memory cells in the memory cell array.

During the test operation of the semiconductor circuit 100, the BIST circuit 12 supplies the input node group 41*d* with pattern data Bit [m−1:0]. Data Bit [n] of the n-th bit of the pattern data is supplied to an input node 41*d*-1. The input node 41*d*-1 and an input/output node 42*d*-1 are connected to the first defective cell. Thus, the data Bit [n] is written in the first defective cell, and data read from the first defective cell is output to the RAM 42 via the input/output node 42*d*-1. This data is output to an output node 44-1 via the RAM 42, an input/output node 43*d*-1, and the RAM 43. The data read from the first defective cell does not coincide with the data written in the first defective cell. Therefore, the data output from the output node 44-1 and the data Bit [n] are compared with each other in the comparison circuit 17, thereby detecting that an initial defect exists in a memory cell of any of the RAMs 41, 42, and 43 in which the data Bit [n] was written (Fail of the output node 44-1 of FIG. 6). On the other hand, since data, other than the data Bit [n] of the n-th bit of the pattern data Bit [m−1:0], is stored in good memory cells of the RAMs 41, 42, and 43, data output from the output node group 44 and data output from the input node group 41*d* coincide with each other (Pass of the output node of FIG. 6).

During the test operation of the semiconductor circuit 100, the BIST circuit 12 compares the data output from the output node group 44 (i.e., the output data of the capture register 8) with the expectation value data while incrementing the address signal input to the RAM as described with reference to FIGS. 3 to 5. The BIST circuit 12 detects that an initial defect exists in a memory cell specified with an address signal and bit information of at least one of the RAMs 41, 42, and 43 from an address signal from which a defect was detected and bit information (in particular, information indicating an order of a bit in the pattern data).

FIG. 7 illustrates a connection relation between the memory cell array, in which the initial defect is avoided through a shift operation, and the input nodes and the output nodes of the RAM.

Defective address information RD_Data, which indicates a bit position (an n-th bit) at which a defect was detected at the operation of FIG. 6, is stored in the fuse element 13. The defective address information RD_Data is transmitted to the flip-flops 41*c*, 42*c*, and 43*c*. The RAM shifts the connection relation between the memory cell array and the input nodes and the output nodes of the RAM such that the data Bit [n] is not stored in the first defective cell that stores the data Bit [n] in the operation depicted in FIG. 3.

Specifically, the input node 41*d*-1 supplied with the data Bit [n] is connected to a memory cell (e.g., a memory cell to which an input node 41*d*-2 was connected in FIG. 6) that stores data Bit [n+1] in the operation of FIG. 6. The input node 41*d*-2 supplied with the data Bit [n+1] is connected to a memory cell that stores data Bit [n+2] in the operation of FIG. 6. That is, data Bit [j] of a j-th bit (j is a natural number satisfying n≤j≤m−1) of the pattern data is stored in a memory cell that stores data Bit [j+1] in the operation of FIG. 6. Furthermore, an input node 41*d*-3 supplied with data Bit [m−1] is connected to the redundant cell array 41*b*.

For the RAMs 42 and 43 as well as the input nodes and the output nodes of the RAM 41, the connection relation between the memory cell array and the input nodes and the output nodes is shifted such that the memory cell that stores the data Bit [n] is skipped.

Specifically, the input/output node 42*d*-1 is connected to memory cells (e.g., a memory cell to which an input node 42*d*-2 was connected in FIG. 6) of the RAMs 41 and 42 that store the data Bit [n+1] in the operation of FIG. 6. An input/output node 42*d*-3 is connected to the redundant cell arrays 41*b* and 42*b*. An input/output node 43*d*-1 is connected to memory cells (e.g., a memory cell to which an input node 43*d*-2 was connected in FIG. 6) of the RAMs 41 and 42 that store the data Bit [n+1] in the operation of FIG. 6. The input/output node 42*d*-3 is connected to the redundant cell arrays 42*b* and 43*b*. An output node 44-1 is connected to a memory cell (e.g., a memory cell to which an input node 44*d*-2 was connected in FIG. 6) of the RAM 43 that stores the data Bit [n+1] in the operation of FIG. 6. An output node 44*d*-3 is connected to the redundant cell array 43*b*.

In the connection relation of FIG. 7, the first defective cell is not used to store data. Therefore, since the data output from the output node 44-1 in the test operation of the BIST circuit 12 coincides with the data input to the input node 41*d*-1, no defect is detected (Pass of the output node 44-1 of FIG. 7). As described above, in the shift operation, the connection relation between the memory cell array and the input nodes and the output nodes of RAM is shifted such that the first defective cell is not used to store data, so that a defect of the RAM is avoided.

Figure 8:
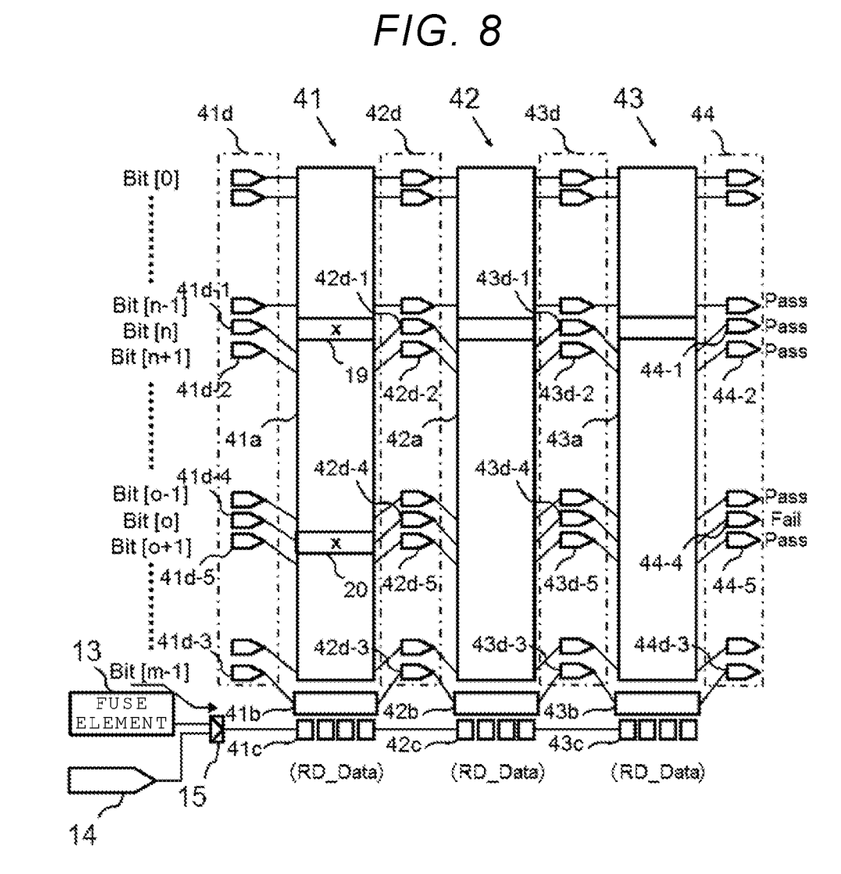
FIG. 8 is a first diagram that illustrates specification of a fault address of a semiconductor circuit according to an embodiment.

Next, after the product is shipped in the state of FIG. 7, a specification method of a fault address when a defect newly occurred in a different memory cell is described with reference to FIGS. 8 and 9. FIG. 8 illustrates a case where a new defect occurred in a position 20 of the memory cell array 41*a* in the state of FIG. 7 in which the shift operation was performed. In the following, a memory cell of the position 20 is called a second defective cell.

At the time of the test operation of the semiconductor circuit 100, the BIST circuit 12 supplies the input node group 41*d* with the pattern data Bit [m−1:0]. Data Bit [o] of the o-th bit of the pattern data is supplied to an input node 41*d*-4. The input node 41*d*-4 and an input/output node 42*d*-4 are connected to the second defective cell. Thus, the data Bit [o] is written in the second defective cell, and data read from the second defective cell is output to the RAM 42 via the input/output node 42*d*-4. This data is output to an output node 44-4 via the RAM 42, an input/output node 43*d*-4, and the RAM 43. The data read from the second defective cell does not coincide with the data written in the second defective cell. Therefore, the data output from the output node 44-1 and the data Bit [o] are compared with each other in the comparison circuit 17, thereby detecting that a defect exists in a memory cell of any of the RAMs 41, 42, and 43 in which the data Bit [o] was written (Fail of the output node 44-4 of FIG. 8). However, at this time point, even though it is possible to know the existence of a defective cell in a bit position (the o-th bit) corresponding to the input node 41*d*-4 and the output node 44-4, it is not possible to determine which RAM 41, 42, or 43 has the defective cell.

Figure 9:
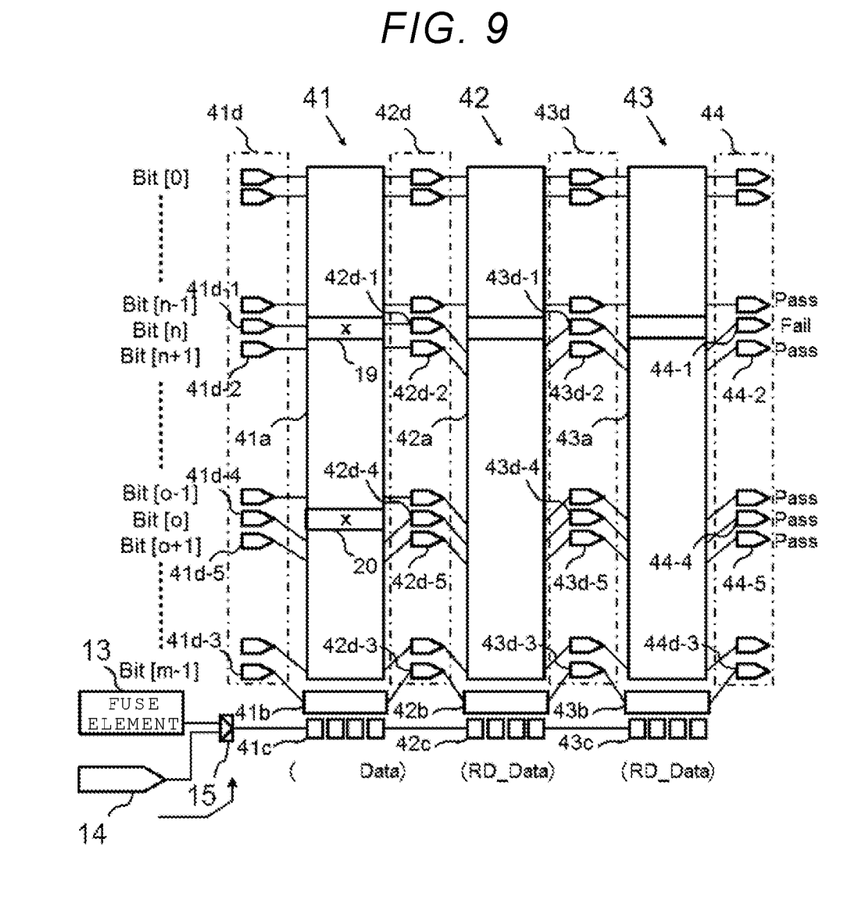
FIG. 9 is a second diagram that illustrates specification of a fault address of a semiconductor circuit according to an embodiment.

In this regard, as illustrated in FIG. 9, only defective address information of one of the flip-flops 41*c*, 42*c*, and 43*c* is changed, thereby specifying which RAM 41, 42, or 43 has the defective cell. In FIG. 9, the selector 15 selects the output of the input terminal 14 and supplies the selected output to the flip-flop 41*c*. Then, the selector 15 receives analysis data from the input terminal 14, and allows the flip-flop 41*c* to hold the analysis data. The flip-flops 42*c* and 43*c* hold the defective address information RD_Data. As described above, only the defective address information held in the flip-flop 41*c* is changed, so that the connection relation between the memory cell array and the input nodes and the output nodes of the RAM is changed as illustrated in FIG. 9.

The input node 41*d*-4 supplied with the data Bit [o] is connected to a memory cell (e.g., a memory cell to which an input node 41*d*-5 was connected in FIG. 8) that stores data Bit [o+1] in the operation of FIG. 8. An input node 41d-5 supplied with the data Bit [o+1] is connected to a memory cell that stores data Bit [o+2] in the operation of FIG. 8. That is, data Bit [k] of a k-th bit (k is a natural number satisfying 0≤k≤m−1) of the pattern data is stored in a memory cell that stores data Bit [k+1] in the operation of FIG. 8.

The input node 42d-4 is connected to a memory cell (e.g., a memory cell of the RAM 41 to which an input node 42d-5 was connected in FIG. 8) that stores the data Bit [o+1] in the operation of FIG. 8. On the other hand, since the defective address information of the RAMS 42 and 43 is not changed, the connection relation between the input/output node groups 42d and 43d/the output node group 44 and the memory cell arrays 42a and 43a is not changed from FIG. 8.

In the connection relation of FIG. 9, the second defective cell is not used to store data. Therefore, since the data output from the output node 44-4 in the test operation of the BIST circuit 12 coincides with the data input to the input node 41d-1, no defect is detected (Pass of the output node 44-4 of FIG. 9).

So far, the case where the defective address information of the flip-flop 41c is changed to the analysis data has been described; however, for example, when the defective address information of the flip-flop 42c is changed to the analysis data and the defective address information RD_Data is allowed to be held in the flip-flops 42c and 43c, the connection relation between the input node group 41d/the input/output node group 42d and the memory cell array 41a is not changed from FIG. 8, and the second defective cell is used to store data. Therefore, a defect of a memory cell is still detected from the output of the output node 44-4. This is also similar to the case where the defective address information of the flip-flop 43c is changed to the analysis data and the defective address information RD_Data is allowed to be held in the flip-flops 41c and 42c.

As described above, in the case where the defective address information of the flip-flops 41c, 42n, and 43c is changed one by one, it is determined whether the defect of the memory cell, which was detected in the operation of FIG. 8, is not detected when which defective address information is changed, thereby specifying the RAM 41, 42, or 43 including a defective cell.

2. Effects According to Present Invention

In the following, a case where a test circuit of a RAM such as the capture resister 8 and the comparison circuit 17 of FIG. 2 are provided to each RAM is considered. In this case, as the number of RAMs increases, since the number of test circuits to be added increases, the chip size is affected. Furthermore, as illustrated in FIG. 1, there is a case where the RAM is disposed in the peripheral region of the semiconductor chip and the logic circuit connected to the RAM is disposed in the center region of the semiconductor chip. In this case, a test circuit and test signal paths are mainly disposed in an intermediate region. When the test circuit increases, since the number of the test signal paths also naturally increases, the test signal paths are crowded in the intermediate region, resulting in a reduction of the degree of freedom of wiring arrangement in the vicinity of the RAM. In this regard, in the semiconductor circuit according to the present embodiment, during the test operation, input nodes and output nodes of a plurality of RAMs are connected to each other in series, and the test circuit such as the capture resister 8 and the comparison circuit 17 is commonly used in the plurality of RAMs connected to one another in series. Therefore, as compared with the case where the test circuit is provided to each RAM, it is possible to reduce the number of the test circuits, so that the chip size becomes small and it is possible to ensure the degree of freedom of wiring arrangement in the vicinity of the RAM.

Furthermore, when the input nodes and the output nodes of the plurality of RAMs are connected to each other in series, since data to be compared with expectation value data is output via the plurality of RAMs, it is not possible to determine which RAM includes a defective cell among the plurality of RAMs. However, in the semiconductor circuit according to the present embodiment, defective address information can be individually set in each RAM. Therefore, as illustrated in FIGS. 8 and 9, the presence or absence of detection of a defective cell is observed by changing defective address information of RAMs one by one, so that it is possible to specify a RAM including the defective cell.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, in the above description, a RAM was used as an example of a memory included in the semiconductor circuit according to the present embodiment. However, the memory is not limited to the RAM if it is a memory in which some of a plurality of memory cells is selected according to an address signal from an exterior of the memory. For example, the memory may include a NAND type flash memory and a NOR type flash memory. Furthermore, in the above description, a SRAM was used as an example of a RAM; however, the RAM is not limited to the SRAM and may include a dynamic random access memory (DRAM), a magnetic random access memory (MRAM), a phase change random access memory (PCRAM), and a ferroelectric random access memory (FeRAM).

Furthermore, in the above description, the number of connection relations shiftable by the shift operation is one per one RAM; however, the number of connection relations shiftable is not limited to one.

What is claimed is:
1. A semiconductor circuit comprising:
   a number of memories equal to j, wherein
      each of the j memories includes an input node, an output node, and a plurality of memory cells, selects some of the plurality of memory cells according to an address signal input from an exterior of the memory, stores data input via the input node in the selected memory cells, reads the data stored in the selected memory cells, and outputs the read data via the output node, and
      the j memories are connected to one another in series from a first memory to a jth memory, such that the output node of a memory of kth memory is connected to the input node of a memory of (k+1)th memory, where k is any integer from 1 to j−1;
   a test circuit configured to output test data to the input node of a memory of the first memory and expectation value data; and
   a comparison circuit configured to compare data output from the output node of jth memory with the expectation value data.

2. The semiconductor circuit according to claim 1, further comprising:
a logic circuit that exchanges data with one of the j memories without passing through any of the other of the j memories.

3. The semiconductor circuit according to claim 2,
wherein the j memories, the test circuit, the comparison circuit, and the logic circuit are provided on a semiconductor chip,
the j memories are disposed in a first region on one side of the semiconductor chip,
the logic circuit is disposed in a second region separated further from the one side than the first region, and
the test circuit and the comparison circuit are disposed in a third region positioned between the first region and the second region.

4. The semiconductor circuit according to claim 2,
wherein the j memories, the test circuit, the comparison circuit, and the logic circuit are provided on a semiconductor chip,
each of the j memories includes a storage circuit that stores defective address information and changes a connection relation between the input node and the output node thereof and a memory cell thereof, according to the defective address information, and
the defective address information stored in the storage circuit is changed by data which is input from an exterior of the semiconductor chip.

5. The semiconductor circuit according to claim 1,
wherein each of the j memories includes a random access memory.

6. A method for testing a plurality of memories, including a first memory and a second memory, each including an array of memory cells, the method comprising:
writing a test pattern including an address and data to the first memory;
reading data output from the first memory, and writing the data output from the first memory into the second memory;
reading data output from the second memory, and capturing the data output from the second memory;
comparing the captured data to expected data to determine whether there is a mismatch; and
upon detecting a mismatch, generating a flag indicating that either the first or the second memory has a defective memory cell.

7. The method for testing according to claim 6, wherein the reading of the data output from the second memory occurs concurrently with the writing of the test pattern into the first memory.

8. The method for testing according to claim 6, further comprising:
storing defect information indicating the defective memory cell in a storage circuit of the first memory; and
configuring the first memory to substitute the defective memory cell with a memory cell from a redundant cell array.

9. The method for testing according to claim 6, further comprising:
storing defect information indicating the defective memory cell in a storage circuit of the second memory; and
configuring the second memory to substitute the defective memory cell with a memory cell from a redundant cell array.

10. The method for testing according to claim 6, further comprising:
if the flag indicates that either the first or second memory has a defective cell, transferring defect information to the first or second memories to determine which of the first or the second memory contains the defective memory cell.

11. A circuit for testing a plurality of memories, including a first memory and a second memory each including an array of memory cells, comprising:
a built-in self test (BIST) circuit operable during a test mode to generate control signals, address signals, pattern data and expected data for testing the arrays of memory cells of the first and second memories;
a first plurality of selectors that receives address signals, the pattern data and control signals from the BIST circuit, and provides the received address signals, pattern data and the control signals to the first memory;
an address register that receives and latches the address signals from the BIST circuit;
a second plurality of selectors that receives the latched address signals from the address register and control signals from BIST circuit and provides the latched address signals and control signals to the second memory;
a third plurality of selectors that connects data outputs of the first memory to data inputs of the second memory;
a capture register that captures data output from the second memory; and
a comparison circuit that compares the expected data with data in the capture register and provides a flag indicating whether a memory cell in either the first or second memory is defective.

12. The circuit according to claim 11, wherein the control signals include a chip enable signal for selecting the first and second memories and a write enable signal for writing data to or reading data from the first and second memories.

13. The circuit according to claim 11, wherein each of the first and second memories includes a redundant cell array that provides memory cells to substitute for defective memory cells in the first and second memories.

14. The circuit according to claim 13, further comprising:
a first and a second flip-flop for storing cell defect information; and
a fuse element that provides defect information to the first and second flip-flops.

15. The circuit according to claim 14, wherein, when the first memory has a defective data bit, the defective data bit is not used and an extra bit is provided from a memory cell of the redundant cell array of the first memory based on the information in the first flip-flop.

16. The circuit according to claim 14, wherein, when the second memory has a defective data bit, the defective data bit is not used and an extra bit is provided from a memory cell of the redundant cell array of the second memory based on the information in the second flip-flop.

17. The circuit according to claim 11, further comprising:
a first and a second flip-flop for storing cell defect information; and
an input terminal through which defect information is transferred into the first and second flip-flops.

* * * * *